(12) United States Patent
Song et al.

(10) Patent No.: US 10,554,184 B2
(45) Date of Patent: Feb. 4, 2020

(54) SHORT-CIRCUIT PROTECTION APPARATUS AND METHOD

(71) Applicant: AutoChips Inc., Hefei (CN)

(72) Inventors: Zhenghua Song, Hefei (CN); Xianfeng Xiong, Hefei (CN); Jiyong Lin, Hefei (CN)

(73) Assignee: AUTOCHIPS INC., Hefei (CN)

( * ) Notice: Subject to any disclaimer, the term of this patent is extended or adjusted under 35 U.S.C. 154(b) by 0 days.

(21) Appl. No.: 15/956,767

(22) Filed: Apr. 19, 2018

(65) Prior Publication Data

US 2019/0199296 A1 Jun. 27, 2019

(30) Foreign Application Priority Data

Dec. 22, 2017 (CN) .......................... 2017 1 1416503

(51) Int. Cl.
*H02H 7/20* (2006.01)
*H03F 1/52* (2006.01)
*H03F 3/217* (2006.01)

(52) U.S. Cl.
CPC ........... *H03F 1/523* (2013.01); *H03F 3/2173* (2013.01); *H03F 3/217* (2013.01); *H03F 2200/03* (2013.01); *H03F 2200/504* (2013.01)

(58) Field of Classification Search
CPC ...... H03F 1/52; H03F 1/523; H03F 2200/504; H03F 3/217; H03G 3/3042
USPC .... 330/298, 51, 296, 10, 251, 207 P, 207 A; 381/120, 121
See application file for complete search history.

(56) References Cited

U.S. PATENT DOCUMENTS

2007/0177322 A1\* 8/2007 Jacobs ...................... H03F 1/52
361/100

\* cited by examiner

*Primary Examiner* — Khanh V Nguyen
*Assistant Examiner* — Khiem D Nguyen

(57) ABSTRACT

The present disclosure provides a short-circuit protection apparatus and method. The short-circuit protection apparatus includes a current detection circuit, a control circuit, a threshold regulating circuit, and a timing circuit. The current detection circuit outputs a detection signal when a detected current is greater than a preset current. The control circuit outputs first and second control signals. The threshold regulating circuit outputs first and second threshold voltages, the first threshold voltage controls the output circuit to operate in first voltage threshold mode and start a first timekeeping by the timing circuit. The first timekeeping is restarted when the detection signal is received before the time of the first timekeeping reaches the first preset value. The output circuit operates in second voltage threshold mode when the time of the first timekeeping reaches the first preset value.

10 Claims, 3 Drawing Sheets

SHORT-CIRCUIT PROTECTION APPARATUS AND METHOD

CROSS-REFERENCE TO RELATED APPLICATIONS

The present application claims all benefits accruing under 35 U.S.C. § 119 from China Patent Application No. 201711416503.7, filed on Dec. 22, 2017 in the China Intellectual Property Office, the disclosure of which is incorporated herein by reference. This application is related to application entitled "short-circuit protection apparatus and method", filed on Jun. 5, 2018 (Application No. 15/997,713).

TECHNICAL FIELD

The described embodiments relate to protection apparatuses, and in particular to a short-circuit protection apparatus and method.

BACKGROUND

Currently, short-circuit protection apparatuses of the power amplifier has primary protection apparatus and continuous protection apparatus. The primary protection apparatus turns off the power amplifier after detecting short-circuit status of the power amplifier, and the power amplifier is no longer in operation. The continuous protection apparatus continuously detects the output current after appearing the short-circuit status of the power amplifier, and the power amplifier is continuously turned off or on according to the detection results. Since the short-circuit status of the power amplifier is divided into instantaneous short-circuit status and persistent short-circuit status, the primary protection apparatus will make the power amplifier turn off no matter when the short-circuit status is instantaneous or persistent, and then manual restart will be required to make the power amplifier return to normal operation. While the circulating protection apparatus will make the power amplifier turn off when the short-circuit status is instantaneous, and when the short-circuit status is eliminated, the power amplifier can automatically resume normal operation. However, in the case of a continuous short-circuit status, the power amplifier will continue to operate in a cycle of turn off and turn on, resulting in the power amplifier being subjected to high current continuously and increasing a risk of damage.

SUMMARY

The main technology issue to be solved in the disclosure is to provide a short-circuit protection apparatus and method, to automatically resume normal operation in the case of short-circuit status, avoid shock of high current on output circuit in case of continuous short-circuit status, and automatically resume normal operation after eliminating short-circuit status.

In order to solve the above-mentioned main technology issue, one approach of the present disclosure is to provide a short-circuit protection apparatus, comprising:

a current detection circuit connected to an output circuit, to detect an output current of the output circuit and output a detection signal when the output current is greater than a preset current;

a control circuit connected to the current detection circuit, to receive the detection signal and output a first control signal and a second control signal according to the detection signal;

a threshold regulating circuit connected to the control circuit, to output a first threshold voltage and a second threshold voltage to the control circuit for controlling the output circuit; and a timing circuit connected to the control circuit:

when the control circuit outputs the first control signal, the threshold regulating circuit outputs the first threshold voltage for controlling the output circuit to operate in a first voltage threshold mode, the timing circuit starts a first timekeeping;

the control circuit receives the detection signal before a time of the first timekeeping reaches a first preset value, the timing circuit restarts the first timekeeping;

the time of the first timekeeping of the timing circuit reaches the first preset value, the control circuit outputs the second control signal for controlling the threshold regulating circuit to output the second threshold voltage to control the output circuit to operate in a second voltage threshold mode;

wherein the first threshold voltage is less than the second threshold voltage, the preset current of the output circuit when operating in the first voltage threshold mode is less than the preset current before entering the first voltage threshold mode.

In order to solve the above-mentioned main technology issue, another approach of the present disclosure is to provide a short-circuit protection method, comprising:

detecting an output current of the output circuit through a current detection circuit;

determining whether the output current is greater than a preset current;

outputting a detection signal when the output current is greater than the preset current;

receiving the detection signal through a control circuit and outputting a first control signal and a second control signal according the detection signal:

receiving the first control signal through a threshold regulating circuit and outputting a first threshold voltage for controlling the output circuit to operate in a first voltage threshold mode, a timing circuit starts a first timekeeping;

determining whether receive the detection signal through the control circuit in a time of the first timekeeping;

receiving the detection signal through the control circuit before the time of the first timekeeping reaches a first preset value, the timing circuit restarts the first timekeeping;

when the time of the first timekeeping of the timing circuit reaches the first preset value, the control circuit outputs the second control signal for make the threshold regulating circuit output a second threshold voltage which is larger than the first threshold voltage, to control the output circuit to operate in a second voltage threshold mode.

The present disclosure has the following advantages: different from the prior art, the short-circuit protection apparatus and method of the present disclosure differentiate a current of the output circuit detected by the current detection circuit is or not greater than a preset current, and the control circuit outputs first and second control signals when the detected current is greater than the preset current. The threshold regulating circuit outputs first and second threshold voltages when the threshold regulating circuit receives the first and second control signals, to make the output circuit operate in the first voltage threshold mode or the second voltage threshold mode, avoid shock of high current on output circuit, and automatically resume normal operation after eliminating short-circuit status.

DETAILED DESCRIPTION

Figure 1:
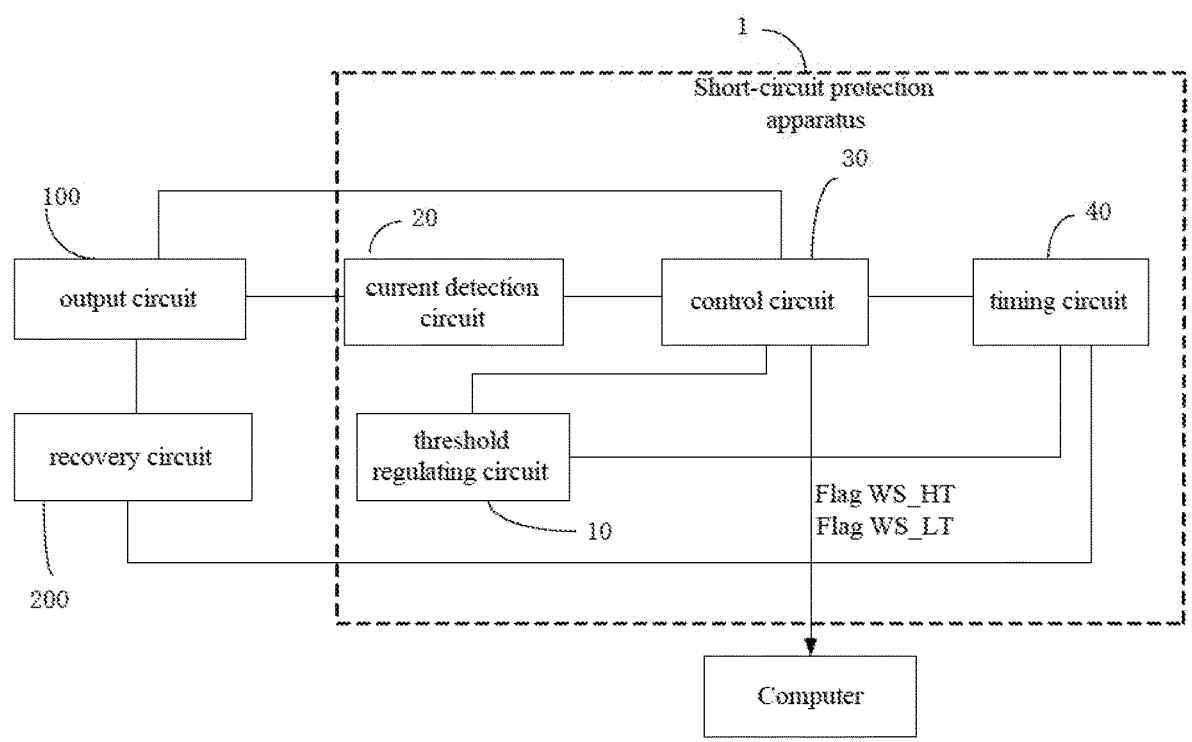
FIG. 1 is a block diagram of the short-circuit protection apparatus of the present disclosure.

Referring to FIG. 1, it show a block diagram of a short-circuit protection apparatus of the present disclosure. The short-circuit protection apparatus 1 may comprise a current detection circuit 20, a control circuit 30 connected to the current detection circuit 20, a threshold regulating circuit 10 connected to the control circuit 30, and a timing circuit 40 connected to the control circuit 30.

The current detection circuit 20 may be connected to an output circuit 100 for detecting an output current of the output circuit 100, and output a detection signal when the output current is greater than a preset current. At the same time, the output circuit 100 is in a short-circuit status, a second short-circuit protection symbol flag WS_HT is set to high.

The control circuit 30 may be connected to the current detection circuit 20, to receive the detection signal and outputs first and second control signals according to the detection signal.

The threshold regulating circuit 10 may be connected to the control circuit 30, to output first and second threshold voltages to the control circuit 30 for controlling the output circuit 100.

The timing circuit 40 may be connected to the control circuit 30. When the control circuit 30 outputs the first control signal, the threshold regulating circuit 10 outputs first threshold voltage for controlling the output circuit 100 to operate in the first voltage threshold mode (low threshold mode), the timing circuit 40 starts a first timekeeping. If the control circuit 30 receives the detection signal before time of the first timekeeping reaches a preset value (that is, in the low threshold mode, the output current of the output circuit 100 is greater than a low threshold preset current, the output circuit 100 is in the short-circuit status, the first protection short-circuit symbol flag WS_LT is set to high), the timing circuit 40 restarts the first timekeeping. If the time of the first timekeeping of the timing circuit 40 reaches the first preset value, the control circuit 30 outputs the second control signal for controlling the threshold regulating circuit 10 to output the second threshold voltage, to further control the output circuit 100 to operate in the second voltage threshold mode (normal operation mode).

The first threshold voltage may be a low threshold operation voltage. The second threshold voltage may be a normal operation voltage. The first threshold voltage may be less than the second threshold voltage. The preset current value (low threshold preset current) of the output circuit 100 when operating in the first voltage threshold mode may be less than the preset current value (normal preset current) before entering the first voltage threshold mode.

Before the output circuit 100 enters the first voltage threshold mode: when the output current of the output circuit 100 detected by the current detection circuit 20 is equal to or less than the preset current, the output circuit 100 operates in the second voltage threshold mode. When the output current of the output circuit 100 detected by the current detection circuit 20 is greater than the preset current, the control circuit 30 controls the output circuit 100 to turned off.

After the control circuit 30 controls the output circuit 100 to turn off: a recovery circuit 200 controls the output circuit 100 to operate in the second voltage threshold mode, the timing circuit 40 starts a second timekeeping.

If the control circuit 30 does not receive the detection signal before the time of the second timekeeping reaches the second preset value, the control circuit 30 controls the threshold regulating circuit 10 to output the second threshold voltage for controlling the output circuit 100 to operate in the second voltage threshold mode.

Before the time of the second timekeeping reaches the second preset time, if the control circuit 30 receives the detection signal again, to control the output circuit 100 to switch between the second voltage threshold mode and off, and continue timekeeping;

When the time of the second timekeeping reaches the second preset time, the control circuit 30 controls the threshold regulating circuit 200 to output the first threshold voltage for controlling the output circuit 100 to operate in the first voltage threshold mode.

The threshold regulating circuit 10 includes a first power D1 and a second power D2. When the threshold regulating circuit 100 outputs the first threshold voltage, the first power D1 turns off, and the second power D2 operates. When the threshold regulating circuit 10 outputs the second threshold voltage, the first power D1 turns on, the first power D1 and the second power D2 operate.

In one embodiment, the output circuit 100 may be an audio power amplifier. The recovery circuit 200 may be a play source circuit. The first preset time may be 200 millisecond. The second preset time may be 800 microsecond.

When the output circuit 100 operates in the first voltage threshold mode, the control circuit 30 receives the detection signal and set the first short-circuit protection symbol flag WS_LT to be high. When the output circuit 100 operates in the second voltage threshold mode, the control circuit 30 receives the detection signal and set the second short-circuit protection symbol flag WS_HT to be high. The first and second short-circuit protection symbols flag WS_LT, flag WS_HT can be stored in computer (for example, single chip microcomputer), for controlling the output circuit 100 and indicating short-circuit statuses. Wherein the output circuit 100 touches the short-circuit protection apparatus in the second voltage threshold mode (that is, the normal work mode), the second short-circuit protection symbol Flag WS_HT is set to high. The output circuit 100 touches the short-circuit protection apparatus in the first voltage threshold mode (that is, the low threshold mode), the first short-circuit protection symbol Flag WS_LT is set to high. The first and second short-circuit protection symbol Flag WS_LT and Flag WS_HT can be used by the computer according to need. A power of the output circuit 100 can be controlled to shut off and the output circuit 100 can be controlled to turn off through software. The first and second short-circuit protection symbols Flag WS_LT and Flag WS_HT can be read from the computer during check for deciding whether the output circuit 100 touches the short-circuit status and obtains short-circuit time (the short-circuit time is a time between two times short-circuit protection symbol).

Figure 2:
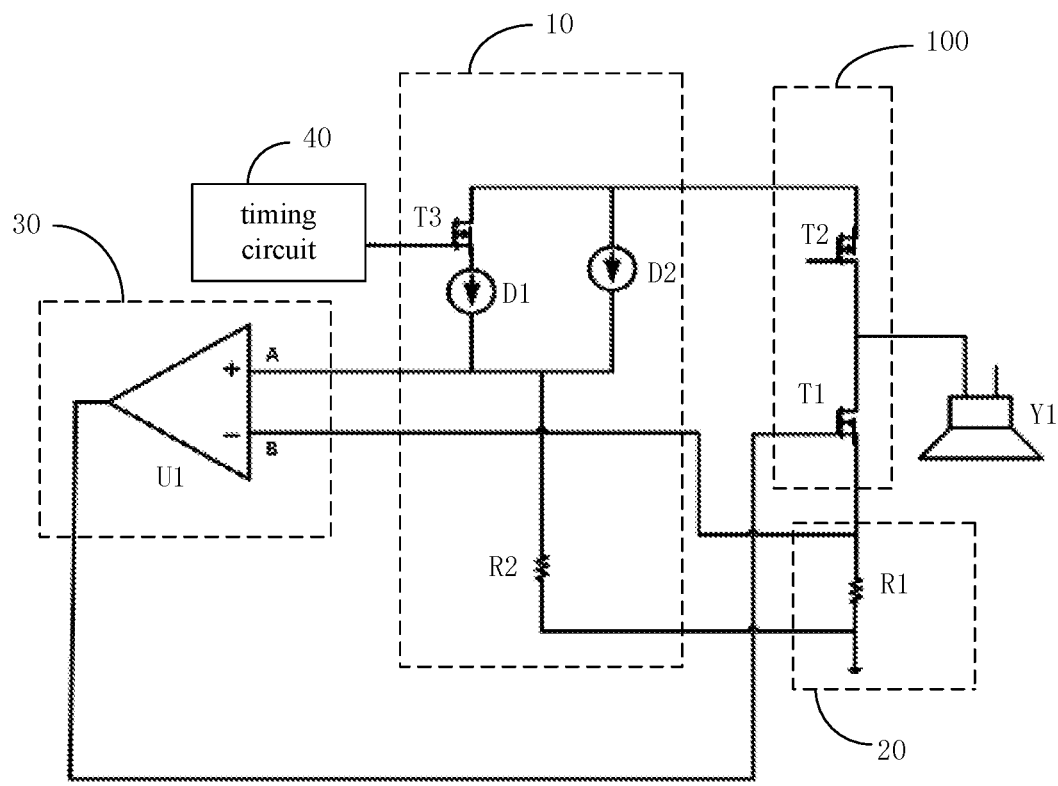
FIG. 2 is a schematic circuit of the short-circuit protection apparatus of the present disclosure.

Referring to FIG. 2, it show a schematic circuit of a short-circuit protection apparatus of the present disclosure. The output circuit 100 includes a first transistor T1 and a second transistor T2. The current detection circuit 20 includes first resistor R1. The control circuit 30 includes a comparator U1. The threshold regulating circuit 10 includes the first power D1, the second power D2, a controllable switch T3, and a second resistor R2. A drain of the first transistor T1 is connected to a drain of the second transistor T2, and then is connected to a speaker Y1. A source of the first transistor T1 is grounded through the first resistor R1. The source of the first transistor T1 is connected to an inverting input terminal of the comparator U1. A gate of the first transistor T1 is connected to an output terminal of the comparator U1. A non-inverting input terminal of the comparator U1 is connected to a source of the second transistor T2 through the second power D2. The non-inverting input terminal of the comparator U1 is connected to a first terminal of the controllable switch T3 through the first power D1. A control terminal of the controllable switch T3 is connected to the timing circuit 40. A second terminal of the controllable switch T3 is connected to the first power D1 and the source of the second transistor T2. The non-inverting input terminal of the comparator U1 is grounded through the second resistor R2.

In one embodiment, the first transistor T1 may be an N-type field effect transistor. The second transistor T2 may be a P-type field effect transistor. The controllable switch T3 may be a P-type field effect transistor (FET). The control terminal, the first terminal, and the second terminal of the controllable switch T3 are corresponding to a gate, a drain, and a source of the P-type FET.

In one embodiment, the short-circuit protection apparatus is a part of circuit connected to one terminal of the speaker Y1, and other parts of circuit connected to another terminal of the speaker Y1 is not be shown. Wherein the first and second transistors T1 and T2 are consist of an output of the power amplifier, for driving the speaker Y1 through Pushing or inhaling high current. The short-circuit protection apparatus of the first transistor T1 is shown in the FIG. 2, and the short-circuit protection apparatus of the second transistor T2 is not shown in the FIG. 2.

The first resistor R1 is a current detection resistor of the first transistor T1, for converting current of the first transistor T1 to voltage. The comparator U1 is an over-current protection comparator, a voltage of the non-inverting input terminal of the comparator U1 is equal to a voltage of the second resistor R2 provided by the second power D2. A voltage of the inverting input terminal of the comparator U1 is equal to a voltage of the first resistor R1.

When the first transistor T1 operates normally (that is, a current through the first resistor R1 is less than a normal preset current), the timing circuit 40 outputs a low level signal to control the controllable switch T3 to be turned on. The first power D1 is turned on. A current through the second resistor R2 is a sum of current of the first power D1 and the second power D2. The voltage of the non-inverting input terminal of the comparator U1 is greater than the voltage of the inverting input terminal of the comparator U1. The comparator U1 outputs a high level signal to control the first transistor T1 to be turned on. The first transistor T1 operates normally. When a larger current through the first resistor R1 (that is, a current through the first resistor R1 is greater than a normal preset current), the detection circuit 20 outputs a detection signal to the control circuit 30. The voltage of the inverting input terminal of the comparator U1 is greater than the voltage of the non-inverting input terminal of the comparator U1. The comparator U1 outputs a low level signal to control the first transistor T1 to be turned off. There is not current flow the first transistor T1. At the same time, the timing circuit 40 starts the second timekeeping, and the time of the second timekeeping is accumulated in microseconds. When the first transistor T1 is turned off for a certain time (for example, 250 microsecond), and the certain time is less than the second preset time (for example, 800 microsecond), the timing circuit 40 outputs a first timing signal to the recovery circuit 200, for controlling the first transistor T1 to be turned on again. The first transistor T1 operates normally. When a current through the first resistor R1 is reduced (for example, the current through the first resistor R1 is less than the normal preset current), the first transistor T1 is at an instantaneous short-circuit status. The recovery circuit 200 controls the first transistor T1 to be turned on for recovering normal operation. If the current through the first resistor R1 remains high (for example, the current through the first resistor R1 is greater than the normal preset current), the comparator U1 outputs a low level signal to control the first transistor T1 to be turned off again. There is not current through the first transistor T1. Thus, the first transistor T1 is turned on or turned off alternately (that is, the first transistor T1 is at persistent short-circuit status). When the time of the second timekeeping of the timing circuit 40 reaches the second preset time (for example, 800 microsecond), the timing circuit 40 outputs second timing signal (for example, a high level signal) to control the controllable switch T3 to be turned off. The threshold regulating circuit 10 outputs the first threshold voltage (that is, the output voltage of the second power D2), the first power D1 is turned off. The first transistor T1 operates in low threshold mode. At the same time, the timing circuit 40 starts the first timekeeping, the time of the first timekeeping is accumulated in milliseconds.

When the first transistor T1 operates in low threshold mode (that is, an output voltage of the second power D2), the first power D1 is turned off. The current through the second resistor R2 is reduced. The voltage of the non-inverting input terminal of the comparator U1 is reduced accordingly. But the voltage of the non-inverting input terminal of the comparator U1 remains greater than the voltage of the inverting input terminal. Therefore, the comparator U1 outputs a high level signal to the first transistor T1 for controlling the first transistor T1 to be turned on. Because the first transistor T1 operates in low threshold mode, the current through the first transistor T1 is at a safe range, no impact on safety, life, and reliability of the first transistor T1. When the current through the first resistor R1 is higher (for example, the current through the first resistor R1 is greater than the low threshold preset current), the voltage of the inverting input terminal of the comparator U1 is greater than the voltage of the non-inverting input terminal of the comparator U1. The comparator U1 outputs a first control signal (for example, a low level signal) to control the first transistor T1 to be turned off. There is not current through the first transistor T1. When the first transistor T1 is turned off for a certain time (for example, 250 microsecond), the recovery circuit 200 controls the first transistor T1 to be turned on again. The first transistor T1 operates normally. If the current through the first resistor R1 remains high (for example, the current through the first resistor R1 is greater than the low threshold preset current), the comparator U1 outputs a low level signal to control the first transistor T1 to be turned off. There is no current through the first transistor T1. Thus, the first transistor T1 is turned on or off alternately in the low threshold mode (the higher current does not impact on the first transistor T1 in the low threshold mode). When the control circuit 30 receives the detection signal in the second preset time (that is, the output current of the output circuit 10 detected by the current detection circuit 20 is greater than the low threshold preset current), the control circuit 30 controls the timing circuit 40 to restart second timing, and thereby continuously cycling until the second timing time reaches the second preset time. The control circuit 30 does not receive the detection signal in the second preset time (that is, the output current of the output circuit 10 detected by the current detection circuit 20 is equal to or less than the low threshold preset current), the timing circuit 40 outputs a third timing signal (for example, a low level signal) to control the controllable switch T3 to be turned on. The threshold regulating circuit 10 receives the second control signal and outputs the second threshold voltage (that is, a sum of the output voltage of the first power D1 and the output voltage of the second power D2). The current through the second resistor R2 is a sum of the current of the first power D1 and the current of the second power D2. The voltage of the non-inverting input terminal of the comparator U1 is greater than the voltage of the inverting input terminal of the comparator U1. The comparator U1 outputs a high level signal to control the first transistor T1 to be turned on. The first transistor T1 operates normally, therefore, the first transistor T1 recovers operation normally (that is, the first transistor T1 operates in the second voltage threshold mode). The principle of the second transistor T2 is the same as the principle of the first transistor T1.

After the first transistor T1 returns to normal operation, because there is no short-circuit status at this time, the first and second transistors T1 and T2 return to normal operation mode is safe and can continue to play music. In one common case, the output wires of the positive and negative terminals of the on-board power amplifier are mistakenly connected together, and the power amplifier will be permanently in an output terminal short-circuit status. In the present invention, because the power amplifier will always circulate in a low threshold mode after a continuous short-circuit status, and the safety of the power amplifier can be guaranteed and the incorrect connection can be checked while waiting for maintenance. In this case, if the traditional circulating protection apparatus is adopted, the power amplifier under the continuous high current impact may cause protection failure, which may lead to the power amplifier short-circuit burning, and in serious case, the whole vehicle may catch fire.

Figure 3:
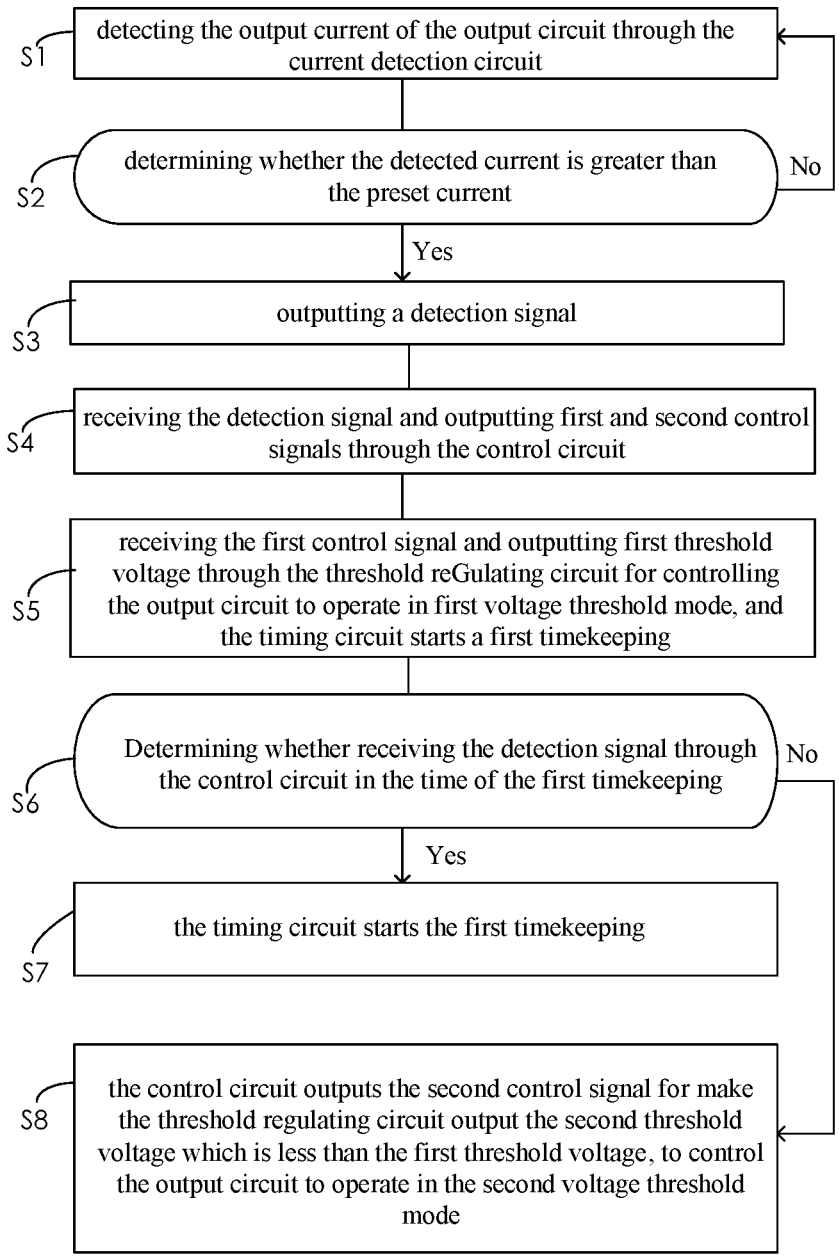
FIG. 3 is a flow chart schematic of the short-circuit protection method of the present disclosure.

Referring to FIG. 3, it show a flow chart schematic of the short-circuit protection method of the present disclosure. The method may comprise the following blocks.

In block S1: detecting the output current of the output circuit 100 by the current detection circuit 20.

In block S2: determining whether the output current is greater than the preset current.

In block S3: outputting the detection signal when the output current is greater than the preset current.

In block S4: receiving the detection signal and outputting the first control signal and the second control signal according to the detection signal by the control circuit 30.

In block S5: receiving the first control signal and outputting the first threshold voltage by the threshold regulating circuit 10, to control the output circuit 100 to operate in the first voltage threshold mode, the timing circuit 40 starts a first timekeeping.

In block S6: determining whether receiving the detection signal in the time of the first timekeeping through the control circuit 30.

In block S7: receiving detection signal before the time of the first timekeeping reaches the first preset value through the control circuit 30, the timing circuit 40 restarts the first timekeeping.

In block S8: if the time of the first timekeeping of the timing circuit 40 reaches the first preset value, the control circuit 30 outputs the second control signal to make the threshold regulating circuit 10 output the second threshold voltage which is less than the first threshold voltage, to control the output circuit 100 to operate in the second voltage threshold mode.

Before the output circuit 100 enters in the first voltage threshold mode:

Determining whether the output current of the output circuit 100 detected by the current detection circuit 20 is greater than the preset current.

When the output current of the output circuit 100 detected by the current detection circuit 20 is equal to or less than the preset current, the output circuit 100 operates in the second voltage threshold mode.

When the output current of the output circuit 100 detected by the current detection circuit 20 is greater than the preset current, the control circuit 30 controls the output circuit 100 to be turned off.

After the control circuit 30 controls the output circuit 100 to be turned off:

Controlling the output circuit 100 to operate in the second voltage mode through the recovery circuit 200, the timing circuit 40 starts the second timekeeping.

Doing not receive the detection signal before the time of the second timekeeping reaches the second preset time, the control circuit 30 controls the threshold regulating circuit 10 to output the second threshold voltage for controlling the output circuit 100 to operate in the second voltage threshold mode.

Receiving the detection signal through the control circuit 30 again before the time of the second timekeeping reaches the second preset time, for controlling the output circuit 100 to switch between the second voltage threshold mode and off, and continue timekeeping.

When the time of the second timekeeping reaches the second preset time, the control circuit 30 controls the threshold regulating circuit 10 to output the first threshold voltage for controlling the output circuit 100 to operate in the first voltage threshold mode.

For example, before the time of the second timekeeping reaches the second preset time, if the control circuit 30 receives the detection signal again, the output circuit 100 will be controlled to be turned off. And then lease again, entering in the second voltage threshold mode. If the control circuit 30 receives the detection signal again, to control the output circuit 100 to be turned off again, and then lease. So repeating until the time of the second timekeeping reaches the second preset time. The control circuit 30 controls the threshold regulating circuit 10 to output the first threshold voltage for controlling the output circuit 100 to operate in the first voltage threshold mode.

There is blocks between the blocks S2 and S3:

When the output current is equal to or less than the preset current, returns to block S2.

When the threshold regulating circuit 10 outputs the first threshold voltage, the first power D1 is turned off, and the second power D2 operates.

When the threshold circuit 10 outputs the second threshold voltage, the first power D1 is turned on, and the first power D1 and the second power D2 operate.

In one embodiment, the first preset time may be 200 millisecond, the second preset time may be 800 microsecond. The second preset time can allow the transistor to be turned on or off three times.

The short-circuit protection apparatus and method determine whether the output current of the output circuit detected the current detection circuit is greater than the preset current, when the detected current is greater than the preset current, the control circuit controls the output circuit to be turned off. When the time of the second timekeeping is less than the second preset time, the output circuit is controlled for being turned on or off alternately, to automatically restore normal operation after a short-circuit status caused by a false trigger. When the threshold regulating circuit outputs the first threshold voltage, the output circuit operates in the low threshold mode and at the same time, the timing circuit starts the first timekeeping. When the control circuit receives the detection signal in the first preset time, the timing circuit restarts the first timekeeping to cycle. When the time of the first timekeeping reaches the first preset time, the threshold regulating circuit outputs the second threshold voltage to make the output circuit operate in the second voltage threshold mode, to avoid the impact of high current on the output circuit in the event of a continuous short-circuit status and to automatically return to normal operation after the short-circuit circuit is eliminated.

The foregoing is merely embodiments of the present disclosure, and is not intended to limit the scope of the disclosure. Any transformation of equivalent structure or equivalent process which uses the specification and the accompanying drawings of the present disclosure, or directly or indirectly application in other related technical fields, are likewise included within the scope of the protection of the present disclosure.

What is claimed is:

1. A short-circuit protection apparatus comprising:
    a current detection circuit connected to an output circuit, to detect an output current of the output circuit and output a detection signal when the output current is greater than a preset current;
    a control circuit connected to the current detection circuit, to receive the detection signal and output a first control signal and a second control signal according to the detection signal;
    a threshold regulating circuit connected to the control circuit, to output a first threshold voltage and a second threshold voltage to the control circuit for controlling the output circuit; and
    a timing circuit connected to the control circuit;
    when the control circuit outputs the first control signal, the threshold regulating circuit outputs the first threshold voltage for controlling the output circuit to operate in a first voltage threshold mode, the timing circuit starts a first timekeeping;
    the control circuit receives the detection signal before a time of the first timekeeping reaches a first preset value, the timing circuit restarts the first timekeeping;
    the time of the first timekeeping of the timing circuit reaches the first preset value, the control circuit outputs the second control signal for controlling the threshold regulating circuit to output the second threshold voltage to control the output circuit to operate in a second voltage threshold mode;
    wherein the first threshold voltage is less than the second threshold voltage, the preset current value of the output circuit when operating in the first voltage threshold mode is less than the preset current value before entering the first voltage threshold mode.

2. The short-circuit protection apparatus of claim 1, wherein before the output circuit enters in the first voltage threshold mode:
    when the output current of the output circuit detected by the current detection circuit is equal to or less than the preset current value, the output circuit operates in the second voltage threshold mode;
    when the output current of the output circuit detected by the current detection circuit is greater than the preset current value, the control circuit controls the output circuit to be turned off.

3. The short-circuit protection apparatus of claim 2, wherein after the control circuit controls the output circuit to be turned off:
    controlling the output circuit to operate in the second voltage threshold mode through the recovery circuit, the timing circuit starts a second timekeeping;
    doing not receive the detection signal before a time of the second timekeeping reaches the second preset time, the control circuit controls the threshold regulating circuit to output the second threshold voltage for controlling the output circuit to operate in the second voltage threshold mode;
    receiving the detection signal through the control circuit again before the time of the second timekeeping reaches the second preset time, to control the output circuit to switch between the second voltage threshold mode and off, and continue timekeeping;
    when the time of the second timekeeping reaches the second preset time, the control circuit controls the threshold regulating circuit to output the first threshold voltage for controlling the output circuit to operate in the first voltage threshold mode.

4. The short-circuit protection apparatus of claim 1, wherein the threshold regulating circuit comprises a first power and a second power, when the threshold regulating circuit outputs the first threshold voltage, the first power is turned off, and the second power operates; when the threshold regulating circuit outputs the second threshold voltage, the first power and the second power operate.

5. The short-circuit protection apparatus of claim 1, wherein when the output circuit operates in the first voltage threshold mode, a first short-circuit protection symbol is set to high by the control circuit after the control circuit receives the detection signal; when the output circuit operates in the second voltage threshold mode, a second short-circuit protection symbol is set to high by the control circuit after the control circuit receives the detection signal; the first and the second short-circuit protection symbols are stored in a computer, to control the output circuit and indicate short-circuit status.

6. The short-circuit protection apparatus of claim 1, wherein the output circuit comprises first and second transistors, the current detection circuit comprises a first resistor, the control circuit comprises a comparator, the threshold regulating circuit comprises a first power, a second power, a controllable switch, and a second resistor, a drain of the first transistor is connected to a drain of the second transistor, and then connected to a speaker, a source of the first transistor is grounded through the first resistor, the source of the first transistor is connected to an inverting input terminal of the comparator, a gate of the first transistor is connected to an output terminal of the comparator, a non-inverting input terminal of the comparator is connected to a source of the second transistor through the second power, the non-inverting input terminal of the comparator is connected to a first terminal of the controllable switch through the first power, a control terminal of the controllable switch is connected to the timing circuit, a second terminal of the controllable switch is connected to the first power and the source of the second transistor, the non-inverting input terminal of the comparator is grounded through the second resistor.

7. The short-circuit protection apparatus of claim 6, wherein the first transistor is an N-channel type field effect transistor, the second transistor is a P-channel type field effect transistor, the controllable switch is a P-channel type field effect transistor, the control terminal, the first terminal, and the second terminal of the controllable switch are corresponding to a gate, a drain, and a source of the P-channel type field effect transistor.

8. A short-circuit protection method comprising:
   detecting an output current of the output circuit through a current detection circuit;
   determining whether the output current is greater than a preset current;
   outputting a detection signal when the output current is greater than the preset current;
   receiving the detection signal through a control circuit and outputting a first control signal and a second control signal according the detection signal;
   receiving the first control signal through a threshold regulating circuit and outputting a first threshold voltage for controlling the output circuit to operate in a first voltage threshold mode, a timing circuit starts a first timekeeping;
   determining whether receiving the detection signal through the control circuit in a time of the first timekeeping;
   receiving the detection signal through the control circuit before the time of the first timekeeping reaches a first preset value, the timing circuit restarts the first timekeeping;
   the time of the first timekeeping of the timing circuit reaches the first preset value, the control circuit outputs the second control signal for make the threshold regulating circuit output a second threshold voltage which is larger than the first threshold voltage, to control the output circuit to operate in a second voltage threshold mode.

9. The short-circuit protection method of claim 8, wherein before the output circuit enters in the first voltage threshold mode further comprises:
   determining whether the output current of the output circuit detected by the current detection circuit is greater than the preset current;
   when the output current of the output circuit detected by the current detection circuit is equal to or less than the preset current, the output circuit operates in the second voltage mode;
   when the output current of the output circuit detected by the current detection circuit is greater than the preset current, the control circuit controls the output circuit to be turned off.

10. The short-circuit protection method of claim 9, wherein after the control circuit controls the output circuit to be turned off further comprises:
   controlling the output circuit to operate in the second voltage threshold mode through a recovery circuit, the timing circuit starts a second timekeeping:
   doing not receive the detection signal before a time of the second timekeeping reaches the second preset time, the control circuit controls the threshold regulating circuit to output the second threshold voltage for controlling the output circuit to operate in the second voltage threshold mode;
   receiving the detection signal through the control circuit again before the time of the second timekeeping reaches the second preset time, to control the output circuit to switch between the second voltage threshold mode and off, and continue timekeeping;
   when the time of the second timekeeping reaches the second preset time, the control circuit controls the threshold regulating circuit to output the first threshold voltage to control the output circuit to operate in the first voltage threshold mode.

* * * * *